(12) United States Patent
Yoshimura et al.

(10) Patent No.: US 8,119,925 B2
(45) Date of Patent: Feb. 21, 2012

(54) CORE SUBSTRATE AND PRINTED WIRING BOARD

(75) Inventors: Hideaki Yoshimura, Kawasaki (JP); Kenji Iida, Kawasaki (JP); Tomoyuki Abe, Kawasaki (JP); Yasutomo Maehara, Kawasaki (JP); Takashi Nakagawa, Kawasaki (JP); Shin Hirano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 427 days.

(21) Appl. No.: 12/390,010

(22) Filed: Feb. 20, 2009

(65) Prior Publication Data

US 2009/0294161 A1 Dec. 3, 2009

(30) Foreign Application Priority Data

May 30, 2008 (JP) .................................. 2008-143450

(51) Int. Cl.
*H05K 1/00* (2006.01)

(52) U.S. Cl. ....................................................... 174/258

(58) Field of Classification Search .................. 174/258, 174/250, 260–262
See application file for complete search history.

(56) References Cited

U.S. PATENT DOCUMENTS

| | | | |
|---|---|---|---|
| 4,667,401 A | 5/1987 | Clements et al. | |
| 4,696,764 A | 9/1987 | Yamazaki | |
| 4,859,364 A | 8/1989 | Yamamoto et al. | |
| 5,242,511 A | 9/1993 | Yokoyama et al. | |
| 5,445,308 A | 8/1995 | Nelson et al. | |
| 5,573,602 A | 11/1996 | Banerji et al. | |
| 5,648,123 A | 7/1997 | Kuhn et al. | |
| 5,652,042 A | 7/1997 | Kawakita et al. | |
| 5,949,030 A | 9/1999 | Fasano et al. | |
| 6,139,777 A | 10/2000 | Omoya et al. | |
| 6,479,763 B1 | 11/2002 | Igaki et al. | |
| 6,851,599 B2 | 2/2005 | Nakamura et al. | |
| 6,869,665 B2 * | 3/2005 | Tani et al. | 428/209 |
| 7,224,046 B2 | 5/2007 | Abe et al. | |
| 7,307,852 B2 | 12/2007 | Inagaki et al. | |
| 7,345,246 B2 | 3/2008 | Muramatsu et al. | |
| 7,507,913 B2 | 3/2009 | Inagaki et al. | |
| 7,640,660 B2 | 1/2010 | Abe et al. | |
| 7,696,442 B2 | 4/2010 | Muramatsu et al. | |
| 7,842,887 B2 | 11/2010 | Sakamoto et al. | |
| 7,855,894 B2 | 12/2010 | Inagaki et al. | |

(Continued)

FOREIGN PATENT DOCUMENTS

CN 1465219 A 12/2003

(Continued)

OTHER PUBLICATIONS

Korean Office Action dated Oct. 21, 2010, issued in corresponding Korean Patent Application No. 10-2009-0019785.

(Continued)

*Primary Examiner* — Javaid Nasri
(74) *Attorney, Agent, or Firm* — Westerman, Hattori, Daniels & Adrian, LLP

(57) ABSTRACT

The core layer of a core substrate is made of carbon fibers impregnated with resin. When the temperature of the core layer increases, the core layer suffers from an increase in the thickness because of thermal expansion of the resin. The core layer is sandwiched between the insulating layers containing glass fibers. The insulating layers serve to suppress an increase in the thickness of the core layer resulting from the thermal expansion of the core layer. Thermal stress is suppressed in the core substrate.

7 Claims, 6 Drawing Sheets

U.S. PATENT DOCUMENTS

| | | |
|---|---|---|
| 7,864,542 B2 | 1/2011 | Inagaki et al. |
| 2003/0196833 A1 | 10/2003 | Fujii et al. |
| 2004/0011855 A1 | 1/2004 | Nakamura et al. |
| 2004/0151882 A1 | 8/2004 | Tani et al. |
| 2004/0238209 A1 | 12/2004 | Yuri et al. |
| 2005/0172483 A1 | 8/2005 | Sugita et al. |
| 2005/0266213 A1 | 12/2005 | Kanda et al. |
| 2006/0118329 A1 | 6/2006 | Nakamura |

FOREIGN PATENT DOCUMENTS

| | | | |
|---|---|---|---|
| CN | 1698138 A | | 11/2005 |
| EP | 0 793 405 A2 | | 3/1997 |
| JP | 10-007933 A1 | | 1/1998 |
| JP | 2003-273518 A | | 9/2003 |
| JP | 2003-527736 A | | 9/2003 |
| JP | 2004-031730 A | | 1/2004 |
| JP | 2004-031731 A | | 1/2004 |
| JP | 2004-289006 A | | 10/2004 |
| JP | 2005-71825 A | | 3/2005 |
| JP | 2005-347414 A | | 12/2005 |
| KR | 1999-0044871 A | | 6/1999 |
| KR | 2003-0027111 A | | 4/2003 |
| KR | 10-2004-0027326 A1 | | 4/2004 |
| TW | 200414860 A | | 8/2004 |
| WO | 99/56509 A1 | | 11/1999 |

OTHER PUBLICATIONS

Korean Office Action dated Oct. 21, 2010, issued in corresponding Korean Patent Application No. 10-2009-0020281.
Chinese Office Action dated Jan. 19, 2011, issued in corresponding Chinese Patent Application No. 200910126964.X.
USPTO Office Action dated May 31, 2011, issued in U.S. Appl. No. 12/390,131.
Korean Office Action dated Oct. 21, 2010, issued in corresponding Korean Patent Application No. 10-2009-0019784.
USPTO Office Action dated May 31, 2011, issued in U.S. Appl. No. 12/390,168.
USPTO Office Action dated Jun. 15, 2011, issued in U.S. Appl. No. 12/365,279.
Office Action dated Nov. 16, 2011, issued in related U.S. Appl. No. 12/390,131, 16 pages.
Taiwanese Office Action dated Oct. 5, 2011, issued in corresponding Taiwanese Patent Application No. 098104959 (partial translation), 6 pages.
Notice of Allowance and Fees Due dated Oct. 5, 2011, issued in related U.S. Appl. No. 12/390,168, 11 pages.
Notice of Allowance and Fees Due dated Dec. 5, 2011, issued in related U.S. Appl. No. 12/365,279, 11 pages.

* cited by examiner

CORE SUBSTRATE AND PRINTED WIRING BOARD

CROSS-REFERENCE TO RELATED APPLICATION

This application is based upon and claims the benefit of priority from the prior Japanese Patent Application No. 2008-143450 filed on May 30, 2008, the entire contents of which are incorporated herein by reference.

FIELD

The embodiment discussed herein is related to a printed wiring board including a core substrate containing carbon fibers.

BACKGROUND

A printed wiring board such as a probe card is well known. The probe card is utilized to examine a semiconductor wafer and an LSI (large-scale integrated circuit) chip package, for example. A semiconductor wafer or an LSI chip package is set on the probe card. A high temperature operation test such as a burn-in test, or a low temperature operation test such as screening is executed. The probe card is subjected to a thermal stress such as a change in the temperature, namely a heat cycle. The temperature is forced to change in a range set for the high temperature test or the low temperature test.

The LSI chip includes a silicon substrate, for example. Silicon has a relatively low coefficient of thermal expansion, so that the LSI chip is allowed to have a relatively low coefficient of thermal expansion. On the other hand, the core substrate of the probe card is made of carbon fiber cloth impregnated with a resin material, for example. The carbon fiber cloth serves to reduce the coefficient of thermal expansion of the core substrate. The coefficient of thermal expansion of the probe card can be equalized to that of the LSI chip. The electrically-conductive pads of the probe card can thus be prevented from shifting from the corresponding electrode pins of the LSI chip, respectively, for example.

Through holes are formed in the core substrate of the probe card. A cylindrical large-sized via having a large diameter is formed on the inner wall surface of the individual through hole. A filling material made of a resin material fills an inner space within the large-sized via. A small-diameter through hole is formed to penetrate through the filling material. A cylindrical small-sized via having a diameter smaller than that of the large-sized via is formed on the inner wall surface of the small-diameter through hole. A filling material fills an inner space within the small-sized via. The filling material serves to electrically insulate the small-sized via and the large-sized via from each other. The filling material is made of epoxy resin, for example.

The carbon fiber cloth of the core substrate is a woven or nonwoven cloth, for example. The carbon fiber cloth extends along the front and back surfaces of the core substrate. This results in significant restriction of the thermal expansion of the resin material occurring in the in-plane direction of the core substrate during the heat cycle test, for example. The thermal expansion of the resin material thus tends to cause an increase in the thickness of the core substrate. The thermal expansion induces cracks in the probe card. Such cracks may cause break of an electrically-conductive pattern.

SUMMARY

According to a first aspect of the present invention, there is provided a core substrate comprising: a core layer made of carbon fibers impregnated with resin; a through hole formed in the core layer, the through hole penetrating through the core layer from the front surface of the core layer to the back surface of the core layer; a cylindrical filling material filling the through hole; a pair of insulating layers made of glass fibers impregnated with resin, the insulating layers being overlaid on the front and back surfaces of the core layer, respectively, so that the core layer is sandwiched between the insulating layers; a through bore formed in the cylindrical filling material, the through bore penetrating through the core layer along the longitudinal axis of the through bore from one of the insulating layers up to the other of the insulating layers; and an electrically-conductive via formed in a shape of a cylinder along the inward wall surface of the through bore.

According to a second aspect of the invention, there is provided a printed wiring board comprising: a core layer made of carbon fibers impregnated with resin; a through hole formed in the core layer, the through hole penetrating through the core layer from the front surface of the core layer to the back surface of the core layer; a cylindrical filling material filling the through hole; a pair of insulating layers made of glass fibers impregnated with resin, the insulating layers being overlaid on the front and back surfaces of the core layer, respectively, so that the core layer is sandwiched between the insulating layers; a through bore formed in the cylindrical filling material, the through bore penetrating through the core layer along the longitudinal axis of the through bore from one of the insulating layers up to the other of the insulating layers; and an electrically-conductive via formed in a shape of a cylinder along the inward wall surface of the through bore.

The object and advantages of the embodiment will be realized and attained by means of the elements and combinations particularly pointed out in the appended claims. It is to be understood that both the foregoing general description and the following detailed description are exemplary and explanatory and are not restrictive of the embodiment, as claimed.

DESCRIPTION OF EMBODIMENT

An embodiment of the present invention will be explained below with reference to the accompanying drawings.

Figure 1:
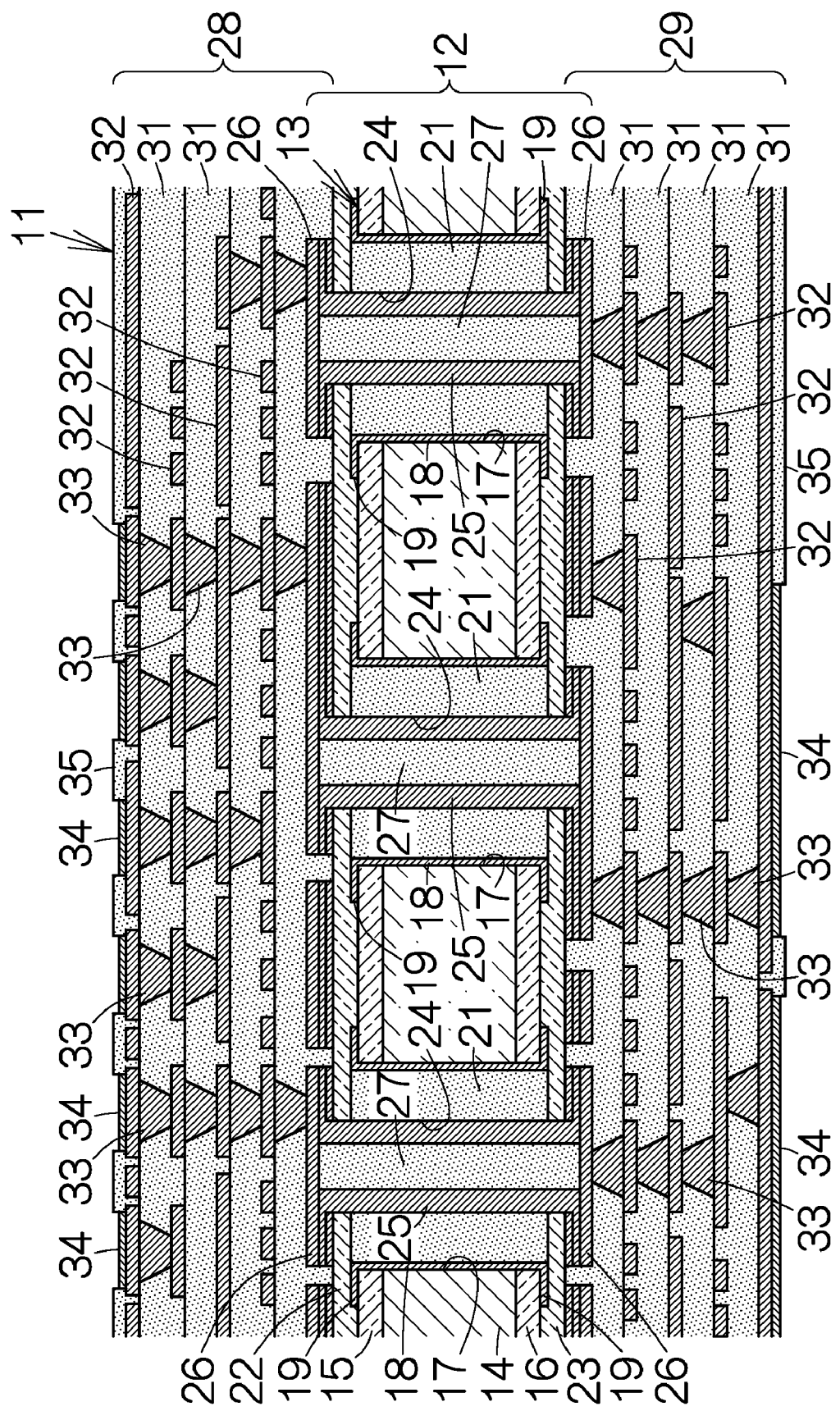
FIG. 1 is an enlarged partial sectional view schematically illustrating the sectional structure of a printed wiring board according to an embodiment of the present invention.

FIG. 1 schematically illustrates the cross-section of a printed wiring board 11 according to an example of the present invention. The printed wiring board 11 is utilized as a probe card, for example. Such a probe card is set in a probe apparatus, for example. It should be noted that the printed wiring board 11 may be utilized in any other electronic apparatus.

The printed wiring board 11 includes a core substrate 12. The core substrate 12 includes a core layer 13 in the form of a thin plate. The core layer 13 includes an electrically-conductive layer 14. Carbon fiber cloth is embedded in the electrically-conductive layer 14. The fibers of the carbon fiber cloth extend along the front and back surfaces of the core layer 13. This results in a significant restriction of the thermal expansion of the electrically-conductive layer 14 in the in-plane direction. The carbon fiber cloth has an electrical conductivity. The carbon fiber cloth is impregnated with a resin material so as to form the electrically-conductive layer 14. The resin material is a thermosetting resin such as epoxy resin. The carbon fiber cloth is a woven or nonwoven cloth made of carbon fiber yarns.

The core layer 13 includes core insulating layers 15, 16 overlaid on the front and back surfaces of the electrically-conductive layer 14, respectively. The electrically-conductive layer 14 is sandwiched between the core insulating layers 15, 16. The core insulating layers 15, 16 are insulative. Glass fiber cloth is embedded in the core insulating layers 15, 16. The fibers of the glass fiber cloth extend along the front and back surfaces of the core layer 13. The glass fiber cloth is impregnated with a resin material so as to form the core insulating layers 15, 16. The resin material is a thermosetting resin such as epoxy resin. The glass fiber cloth is a woven or nonwoven cloth made of glass fiber yarns.

Through holes 17 are formed in the core layer 13. The through holes 17 penetrate through the core layer 13 from the front surface to the back surface of the core layer 13. The through holes 17 each define a columnar space. The longitudinal axis of the columnar space is set perpendicular to the front and back surfaces of the core layer 13. The individual through hole 17 defines circular openings on the front and back surfaces of the core layer 13, respectively.

A large-sized via 18 having a large diameter is formed in the individual through hole 17. The large-sized via 18 is electrically conductive. The large-sized via 18 is formed in the shape of a cylinder along the inward wall surface of the through hole 17. The large-sized via 18 is connected to annular electrically-conductive lands 19 on the front and back surfaces of the core layer 13. The electrically-conductive lands 19 extend on the front and back surface of the core layer 13. The large-sized via 18 and the electrically-conductive lands 19 are made of an electrically-conductive material such as copper.

The inner space of the large-sized via 18 in the through hole 17 is filled with a filling material 21 made of a resin material. The filling material 21 takes the form of a cylinder along the inward wall surface of the large-sized via 18. The filling material 21 is a thermosetting resin such as epoxy resin. A ceramic filler is embedded in the epoxy resin, for example.

The core substrate 12 includes insulating layers 22, 23 overlaid on the front and back surfaces of the core layer 13, respectively. The back surfaces of the insulating layers 22, 23 are received on the front and back surfaces of the core layer 13, respectively. The core layer 13 is sandwiched between the insulating layers 22, 23. The insulating layers 22, 23 cover over the exposed surfaces of the filling material 21. The insulating layers 22, 23 are insulative. Glass fiber cloth is embedded in the insulating layers 22, 23. The fibers of the glass fiber cloth extend along the front and back surfaces of the core layer 13. The glass fiber cloth is impregnated with a resin material so as to form the insulating layers 22, 23. The resin material is a thermosetting resin such as epoxy resin. The glass fiber cloth is a woven or nonwoven cloth made of glass fiber yarns.

Through holes 24 are formed in the core substrate 12. The through holes 24 penetrate through the core layer 13 and the insulating layers 22, 23. The individual through hole 24 is located inside the corresponding through hole 17. The through bore 24 penetrates through the corresponding filling material 21. Here, the through holes 24 each define a columnar space. The individual through hole 24 is coaxial with the corresponding through hole 17. The individual through hole 24 defines circular openings on the front and back surfaces of the core substrate 12, respectively.

A small-sized via 25 having a diameter smaller than that of the large-sized via 18 is formed in the individual through bore 24. The small-sized via 25 is electrically conductive. The small-sized via 25 is formed in the shape of a cylinder along the inward wall surface of the through bore 24. The filling material 21 serves to insulate the large-sized via 18 and the small-sized via 25 from each other. The small-sized via 25 is made of an electrically-conductive material such as copper.

Electrically-conductive lands 26 are formed on the surfaces of the insulating layers 22, 23. The small-seized via 25 is connected to the electrically-conductive lands 26 on the surfaces of the insulating layers 22, 23. The electrically-conductive lands 26 are made of an electrically-conductive material such as copper. The inner space of the small-sized via 25 is filled with a filling material 27 made of an insulating resin between the electrically-conductive lands 26, 26. The filling material 27 is formed in the shape of a column, for example. The filling material 27 is a thermosetting resin such as epoxy resin. Ceramic fillers are embedded in the epoxy resin.

Build-up layers 28, 29 are formed on the surfaces of the insulating layers 22, 23, respectively. The back surfaces of the build-up layers 28, 29 are received on the surfaces of the insulating layers 22, 23, respectively. The core layer 13 and the insulating layers 22, 23 are sandwiched between the build-up layers 28, 29. The build-up layers 28, 29 cover over the corresponding electrically-conductive lands 26, 26.

The build-up layers 28, 29 are a multilayered structure body including insulating layers 31 and electrically-conductive patterns 32. The insulating layers 31 and the electrically-conductive patterns 32 are alternatively overlaid on one another. Electrical connection is established between the electrically-conductive patterns 32 formed in different layers through vias 33. The insulating layers 31 are made of a thermosetting resin such as epoxy resin. The electrically-conductive patterns 32 and the vias 33 are made of an electrically-conductive material such as copper.

Electrically-conductive pads 34 are exposed on the surfaces of the build-up layers 28, 29. The electrically-conductive pads 34 are made of an electrically-conductive material such as copper. An overcoat layer 35 is overlaid on the surface of each of the build-up layers 28, 29 at positions off the electrically-conductive pads 34. The overcoat layer 35 is made of epoxy resin, for example. The electrically-conductive pads 34 on the back surface of the printed wiring board 11 are connected to the electrode terminals on a probe apparatus, for example. The electrically-conductive pads 34 on the front surface of the printed wiring board 11 are mounted on the electrode bumps of a semiconductor wafer, for example. A heat cycle test is then executed so as to examine the semiconductor wafer, for example.

In the printed wiring board 11, the fibers of the carbon fiber cloth extends in the in-plane direction of the electrically-conductive layer 14. The electrically-conductive layer 14 suffers from an increase in the thickness because of the thermal expansion of the resin material in the electrically-conductive layer 14 during the heat cycle test, for example. The electrically-conductive layer 14 is sandwiched between the insulating layers 22, 23. Since the insulating layers 22, 23 contain glass fiber cloth, the insulating layers 22, 23 have a relatively high strength. The insulating layers 22, 23 thus serve to suppress an increase in the thickness resulting from the thermal expansion of the electrically-conductive layer 14. This results in suppression of thermal stress in the printed wiring board 11. Cracks are thus avoided in the build-up layers 28, 29, for example. Break of the electrically-conductive patterns 32 is avoided. Moreover, the insulating layers 22, 23 cover over the exposed surfaces of the filling material 21, respectively. The insulating layers 22, 23 extend across the boundaries between the electrically-conductive layer 14 and the filling material 21. This results in a significant suppression of generation of cracks along the boundaries between the electrically-conductive layer 14 and the filling material 21. In the case where a printed wiring board does not include the aforementioned insulating layers 22, 23, the electrically-conductive layer 14 suffers from an increase in the thickness of the electrically-conductive layer 14 resulting from the thermal expansion. Cracks can be generated in a build-up layer, for example. Break of an electrically-conductive pattern can be caused.

Figure 2:
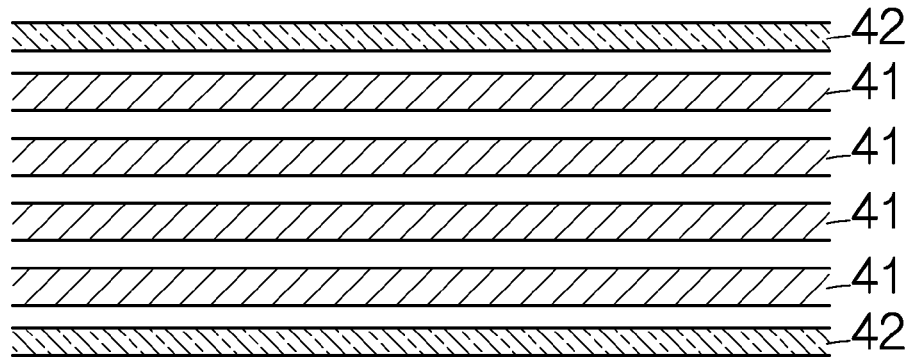
FIG. 2 is an enlarged partial sectional view schematically illustrating a process of overlaying prepregs on one another.

Next, description will be made on a method of making the printed wiring board 11. The core substrate 12 is first prepared. As shown in FIG. 2, four prepregs 41 are prepared, for example. The individual prepreg 41 contains carbon fiber cloth. Simultaneously, a pair of prepregs 42 is prepared, for example. The individual prepreg 42 contains glass fiber cloth. The carbon fiber cloth is impregnated with epoxy resin varnish for forming the prepregs 41. Likewise, the glass fiber cloth is impregnated with epoxy resin varnish for forming the prepregs 42. The epoxy resin varnish is then dried. The prepregs 41, 42 are in this manner formed.

Figure 3:
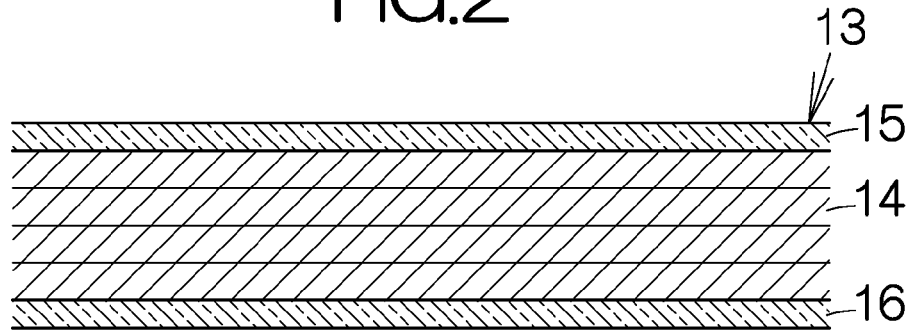
FIG. 3 is an enlarged partial sectional view schematically illustrating the process of overlaying the prepregs on one another.

The prepregs 41 are sandwiched between the prepregs 42, 42. The prepregs 42 are urged against each other while being subjected to a heating process. A vacuum press is employed to urge the prepregs 42, for example. The peak temperature of the heating process and the pressure of the vacuum press are set in accordance with predetermined conditions. The prepregs 41, 42 are bonded together based on the molten epoxy resin. In this manner, the core layer 13 is formed, as shown in FIG. 3. The prepregs 41 provides form the electrically-conductive layer 14. The prepregs 42 form the core insulating layers 15, 16, respectively.

Figure 4:
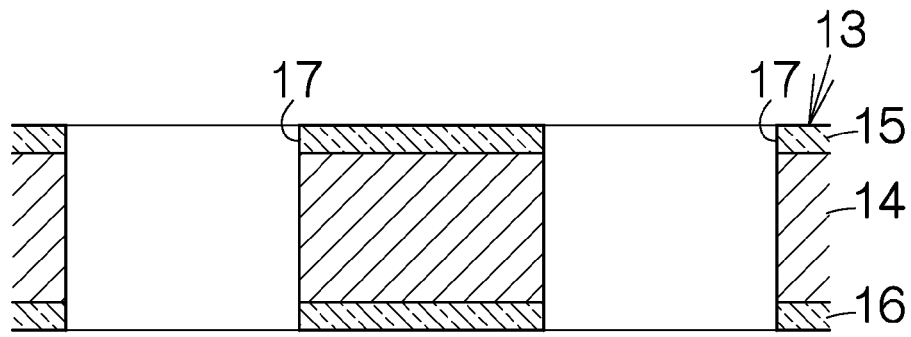
FIG. 4 is an enlarged partial sectional view schematically illustrating a process of forming through holes in a core layer.
Figure 5:
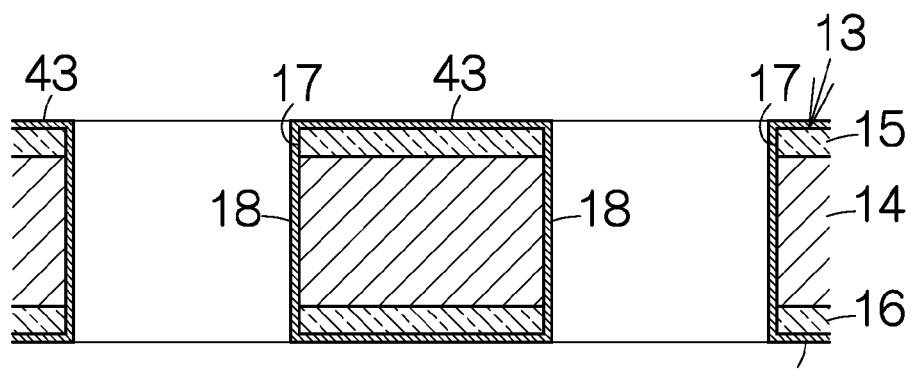
FIG. 5 is an enlarged partial sectional view schematically illustrating a process of forming a copper plating layer on the core layer.

As shown in FIG. 4, the through holes 17 are formed in the core layer 13 at predetermined positions. A drill may be utilized to form the through holes 17, for example. The through holes 17 penetrate through the core layer 13 from the front surface to the back surface of the core layer 13. Electrolytic plating or electroless plating is effected on the entire surface of the core layer 13, for example. A copper plating layer 43 is thus formed over the entire surface of the core layer 13, as shown in FIG. 5. The copper plating layer 43 is formed along the front and back surfaces of the core layer 13 and the inward wall surfaces of the through holes 17 at a predetermined thickness. In this manner, the large-sized vias 18 are formed inside the through holes 17.

Figure 6:
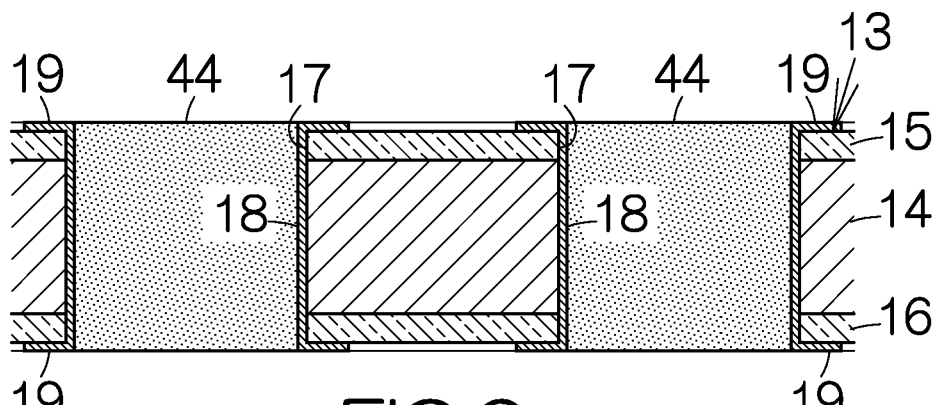
FIG. 6 is an enlarged partial sectional view schematically illustrating a process of pouring a resin material into the through holes.

As shown in FIG. 6, a resin material 44 is filled in the large-sized vias 18. The resin material 44 is a solvent epoxy resin, for example. The resin material 44 is subjected to a heating process. The resin material 44 is thus hardened or cured. Buffing is employed to remove the resin material 44 overflowing from the large-sized vias 18, for example. A resist film, not shown, is then formed on each of the front and back surfaces of the core layer 13 in a predetermined pattern. Etching is effected on the copper plating layer 43 outside the contour of the resist film. The resist film is removed after the etching. The electrically-conductive lands 19 are thus formed on the front and back surfaces of the core layer 13.

Figure 7:
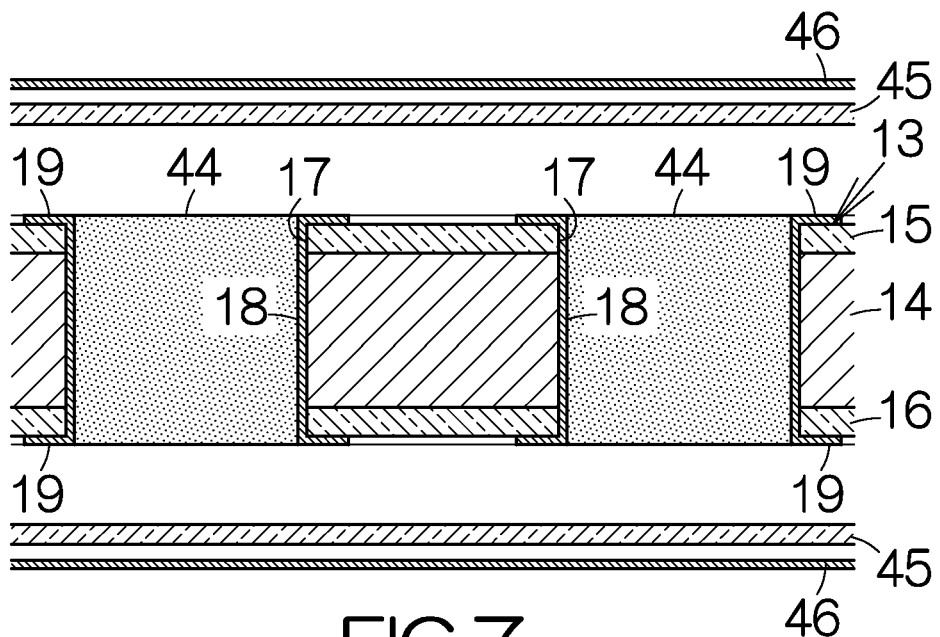
FIG. 7 is an enlarged partial sectional view schematically illustrating a process of overlaying a prepreg and a copper foil on each of the front and back surfaces of the core layer.
Figure 8:
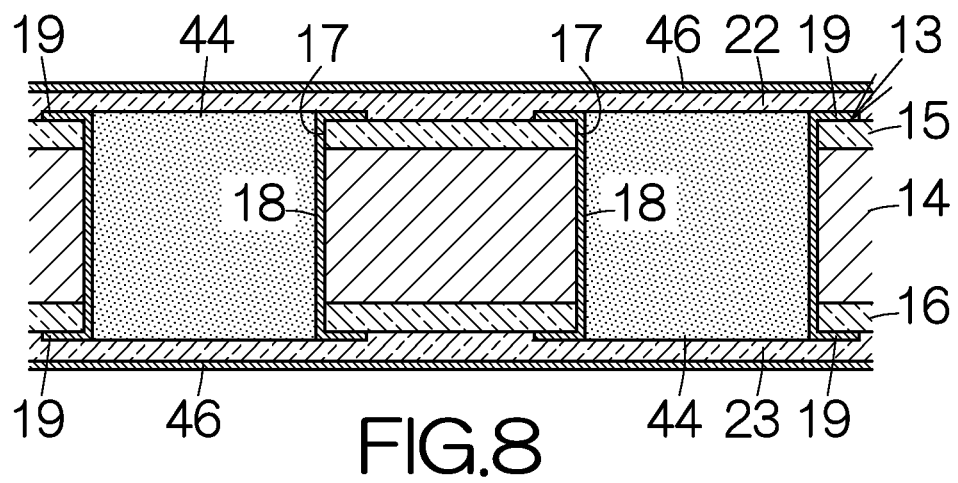
FIG. 8 is an enlarged partial sectional view schematically illustrating the process of overlaying the prepreg and the copper foil on each of the front and back surfaces of the core layer.

As shown in FIG. 7, a pair of prepregs 45, 45 and a pair of copper foils 46, 46 are prepared. The prepregs 45 have the same structure as that of the aforementioned prepregs 42. The prepreg 45 and the copper foil 46 are in this sequence overlaid on the front and back surfaces of the core layer 13. The copper foils 46 and the prepregs 45 are urged against the front and back surfaces of the core layer 13 while being subjected to a heating process. A vacuum press is employed to urge the copper foils 46 and the prepregs 45. The peak temperature of the heating process and the duration of the vacuum press are set in accordance with predetermined conditions. The prepregs 45 and the copper foils 46 are bonded to the front and back surfaces of the core layer 13, as shown in FIG. 8, based on the molten epoxy resin. The prepregs 45 form the insulating layers 22, 23. The insulating layers 22, 23 cover over the exposed surfaces of the resin material 44 on the front and back surfaces of the core layer 13, respectively.

Figure 9:
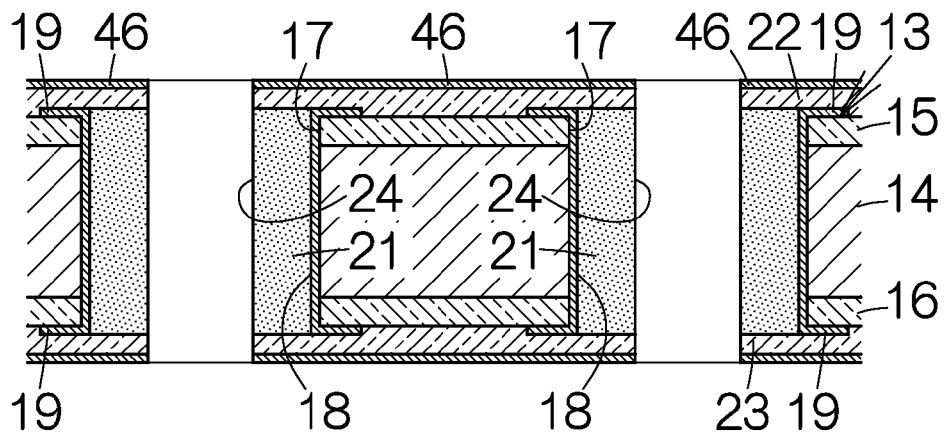
FIG. 9 is an enlarged partial sectional view schematically illustrating a process of forming through holes in the core layer.
Figure 10:
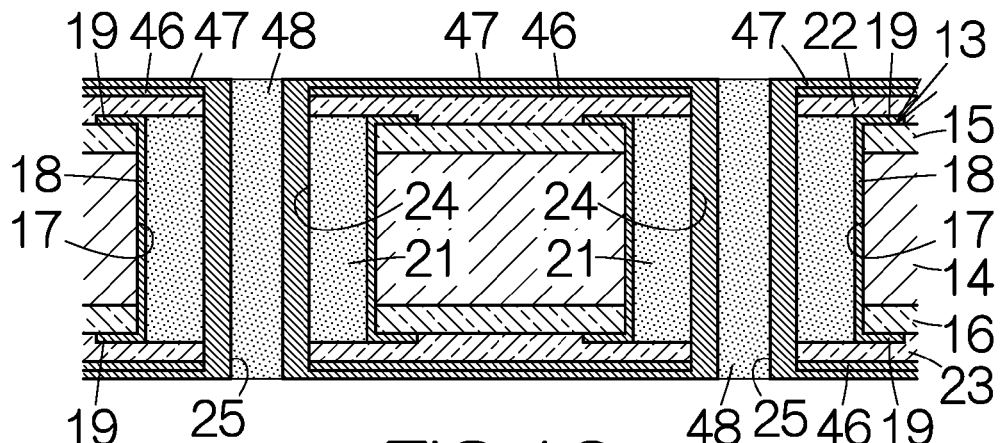
FIG. 10 is an enlarged partial sectional view schematically illustrating a process of forming a copper plating layer.

As shown in FIG. 9, the through holes 24 are formed in the resin material 44 inside the through holes 17 of the core layer 13. The through holes 24 may be coaxial with the corresponding through holes 17. A drill may be utilized to form the through holes 24, for example. The through holes 24 penetrate through the core layer 13 from the front surface to the back surface of the core layer 13. Electrolytic plating or electroless plating is effected on the entire surface of the core layer 13, for example. A copper plating layer 47 is thus formed over the entire surface of the core layer 13, as shown in FIG. 10. The copper plating layer 47 is formed along the front and back surfaces of the core layer 13 and the inward wall surfaces of the through holes 24 at a predetermined thickness. The small-sized vias 25 are in this manner formed inside the through holes 24.

Figure 11:
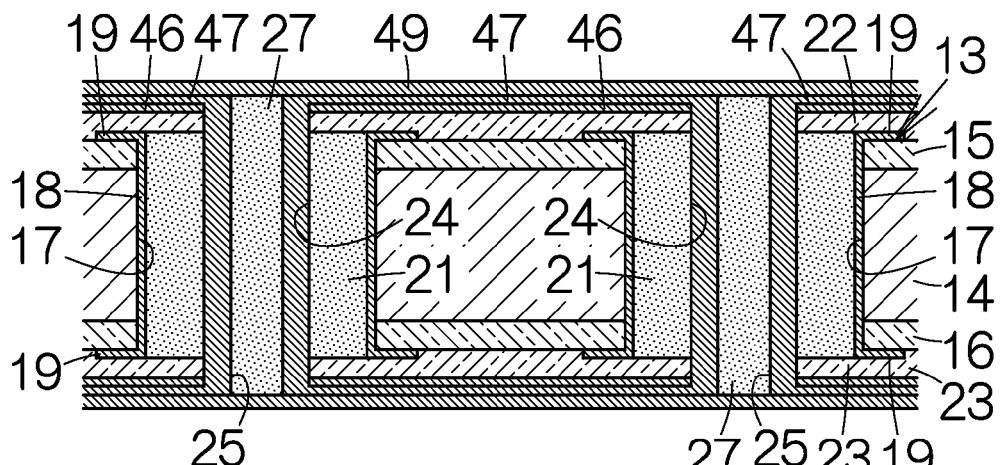
FIG. 11 is an enlarged partial sectional view schematically illustrating a process of forming a copper plating layer.
Figure 12:
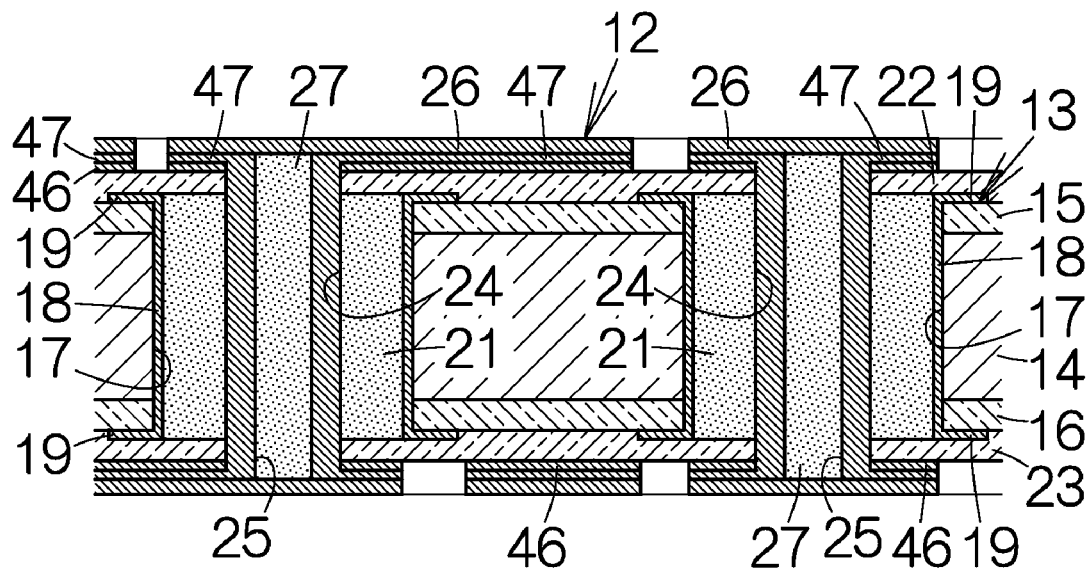
FIG. 12 is an enlarged partial sectional view schematically illustrating a process of forming electrically-conductive lands.

A resin material 48 is filled in the small-sized vias 25. The resin material 48 is a solvent epoxy resin, for example. The resin material 48 is subjected to a heating process. The resin material 48 is thus hardened or cured. Buffing is employed to remove the resin material 48 overflowing from the small-sized vias 25, for example. Electrolytic plating or electroless plating is effected on the entire surface of the core layer 13, for example. In this manner, a copper plating layer 49 is formed on each of the front and back surfaces of the core layer 13, as shown in FIG. 11. The openings of through holes 24 are closed with the copper plating layer 49. A resist film, not shown, is formed on each of the front and back surfaces of the core layer 13 in a predetermined pattern. Etching is effected on the copper plating layer 49 outside the contour of the resist film. The electrically-conductive lands 26 are thus formed on the front and back surfaces of the core layer 13, as shown in FIG. 12. In this manner, the core substrate 12 is formed.

Figure 13:
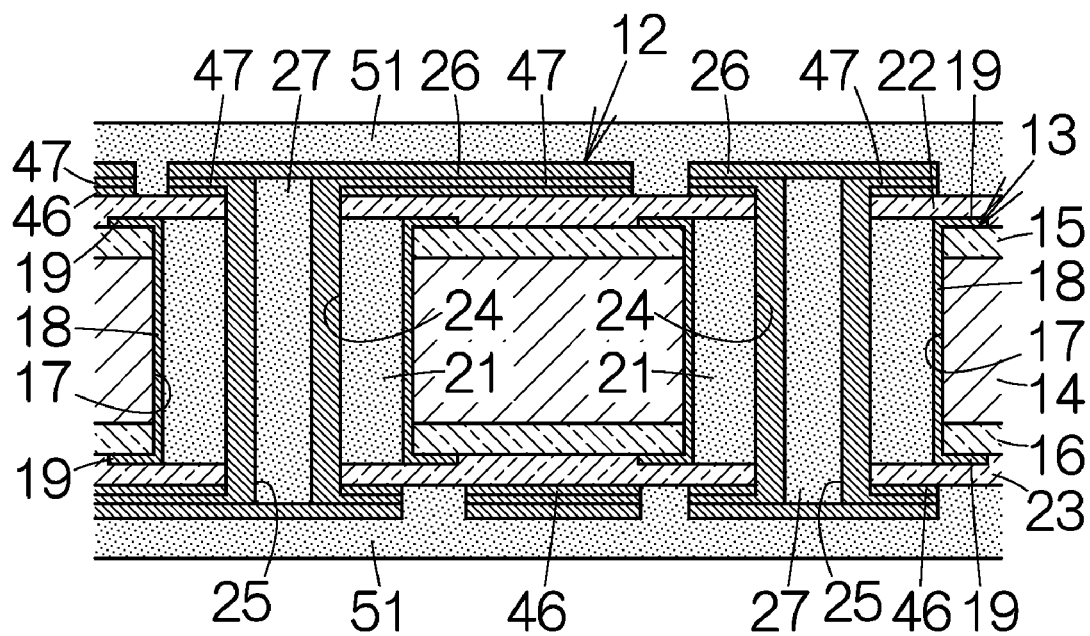
FIG. 13 is an enlarged partial sectional view schematically illustrating a process of forming an insulating layer on the surface of the core substrate.

Next, the build-up layers 28, 29 are formed on the front and back surfaces of the core substrate 12, respectively. The build-up layers 28, 29 are simultaneously formed. As shown in FIG. 13, a resin sheet 51 is overlaid on each of the front and back surfaces of the core substrate 12. The resin sheets 51 are urged against the front and back surfaces of the core substrate 12 while being subjected to a heating process. A vacuum press is executed to urge the resin sheets 51. The peak temperature of the heating process and the pressure of the vacuum press are set in accordance with predetermined conditions. The resin sheets 51 are hardened or cured through the heating process. The resin sheets 51 thus provide the insulating layers 31.

Figure 14:
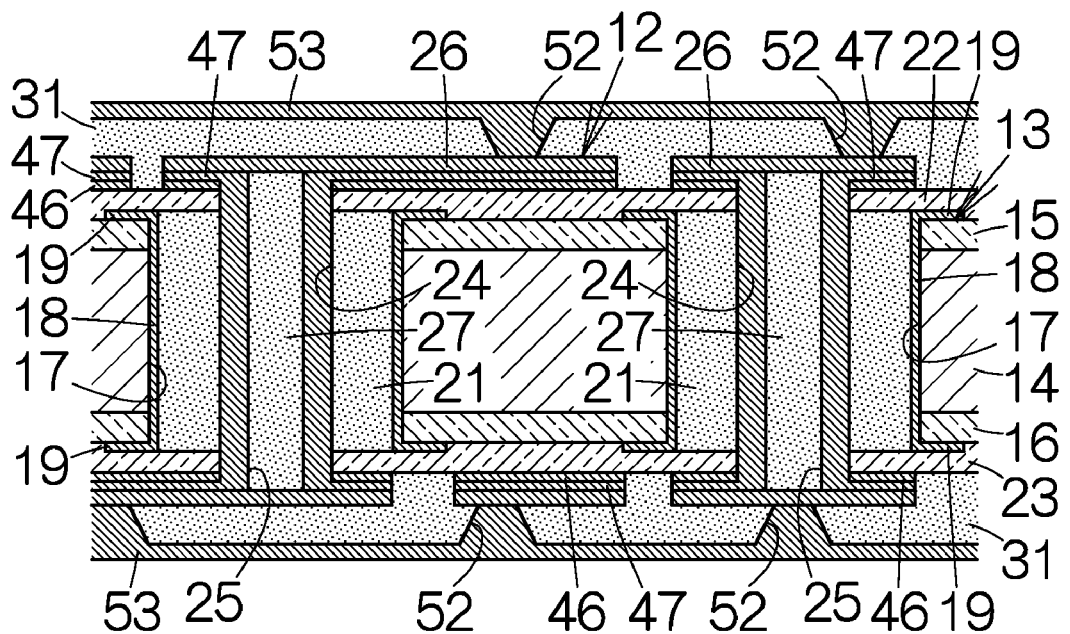
FIG. 14 is an enlarged partial sectional view schematically illustrating a process of forming a copper plating layer on the insulating layer.
Figure 15:
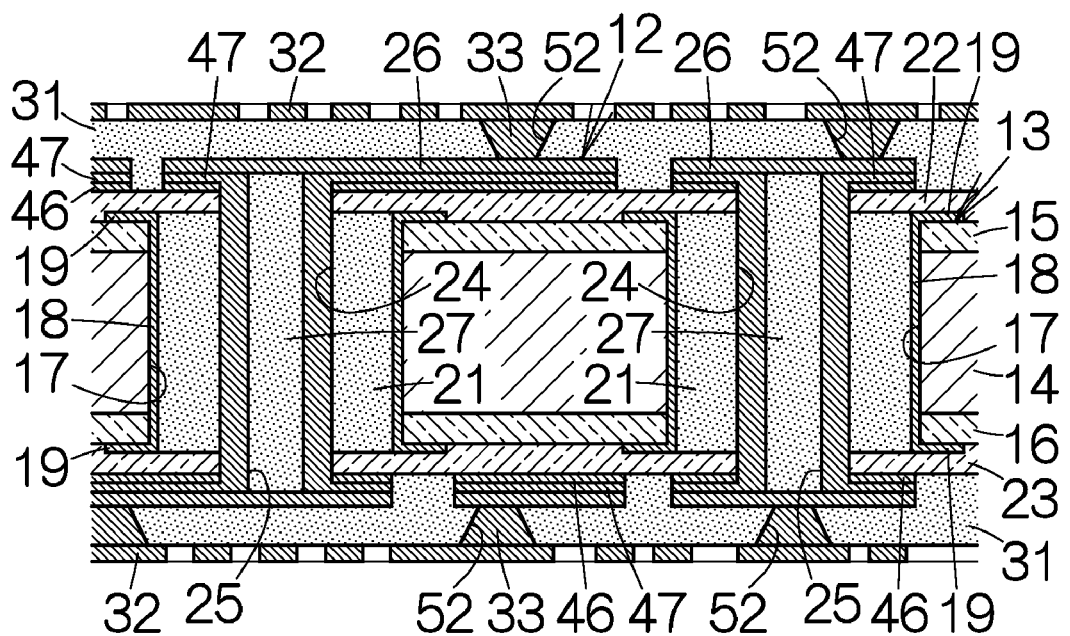
FIG. 15 is an enlarged partial sectional view schematically illustrating a process of forming an electrically-conductive pattern on the insulating layer.

A UV-YAG laser is applied to the individual insulating layer 31 at predetermined positions, for example. Holes 52 are thus formed in the insulating layer 31, as shown in FIG. 14. The electrically-conductive lands 26 are exposed at the bottoms of the holes 52, for example. A copper plating layer 53 is formed on the surface of the insulating layer 31 and inside the holes 52. Electroless plating is effected for forming the copper plating layer 53, for example. A resist film, not shown, is formed on the surface of the copper plating layer 53 in a predetermined pattern. Etching is effected on the copper plating layer 53 outside the contour of the resist film. The resist film is then removed. The electrically-conductive pattern 32 is thus formed on the surface of the insulating layer 31, as shown in FIG. 15. The vias 33 are formed in the holes 52.

The process of overlaying the insulating layer 31 and the process of forming the electrically-conductive pattern 32 are repeated. The aforementioned electrically-conductive pads 34 are formed on the uppermost or exposed one of the insulating layers 31 on the front and back surfaces of the core layer 13. An overcoat layer, not shown, is formed on the surface of the uppermost one of the insulating layers 31. The overcoat layer may be made of a resin material, for example. Screen printing or photolithography may be effected for forming the overcoat layer, for example. Openings are formed in the overcoat layer at predetermined positions. The electrically-conductive pads 34 are exposed at the bottoms of the openings. The build-up layers 28, 29 are in this manner formed on the front and back surfaces of the core substrate 12, respectively. The printed wiring board 11 is produced.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A core substrate comprising:
   a core layer including an electrically-conductive layer made of carbon fibers impregnated with resin and core insulating layers overlaid on front and back surfaces of the electrically-conductive layer, the core insulating layers made of glass fibers impregnated with resin;
   a through hole formed in the core layer, the through hole penetrating through the core layer from a front surface of the core layer to a back surface of the core layer;
   a cylindrical filling material filling the through hole;
   a pair of overlying insulating layers made of glass fibers impregnated with resin, the overlying insulating layers being overlaid on the front and back surfaces of the core layer, respectively, so that the core layer and the cylindrical filling material are sandwiched between the overlying insulating layers;
   a through bore formed in and penetrating through at least one of the overlying insulating layers along a longitudinal axis of the through hole; and
   an electrically-conductive via formed in a shape of a cylinder along an inward wall surface of the through bore.

2. The core substrate according to claim 1, wherein the overlying insulating layers cover over the filling material.

3. The core substrate according to claim 1, wherein the glass fibers form a woven cloth or a nonwoven cloth.

4. A printed wiring board comprising:
   a core layer including an electrically-conductive layer made of carbon fibers impregnated with resin and core insulating layers overlaid on front and back surfaces of the electrically-conductive layer, the core insulating layers made of glass fibers impregnated with resin;
   a through hole formed in the core layer, the through hole penetrating through the core layer from a front surface of the core layer to a back surface of the core layer;
   a cylindrical filling material filling the through hole;
   a pair of overlying insulating layers made of glass fibers impregnated with resin, the overlying insulating layers being overlaid on the front and back surfaces of the core layer, respectively, so that the core layer and the cylindrical filling material are sandwiched between the overlying insulating layers;
   a through bore formed in and penetrating through at least one of the overlying insulating layers along a longitudinal axis of the through hole; and
   an electrically-conductive via formed in a shape of a cylinder along an inward wall surface of the through bore.

5. The printed wiring board according to claim 4, wherein the overlying insulating layers cover over the filling material.

6. The printed wiring board according to claim 4, wherein the glass fibers form a woven cloth or a nonwoven cloth.

7. The printed wiring board according to claim 4, further comprising a build-up layer overlaid on at least one of the overlying insulating layers.

* * * * *